United States Patent [19]

Huang

[11] 4,276,514
[45] Jun. 30, 1981

[54] WIDEBAND, PHASE COMPENSATED AMPLIFIER WITH NEGATIVE FEEDBACK OF DISTORTION COMPONENTS IN THE OUTPUT SIGNAL

[75] Inventor: Marshall Y. Huang, Rancho Palos Verdes, Calif.

[73] Assignee: TRW Inc., Redondo Beach, Calif.

[21] Appl. No.: 55,672

[22] Filed: Jul. 9, 1979

[51] Int. Cl.³ .............................................. H03D 1/00
[52] U.S. Cl. .................................... 330/149; 330/109; 330/294; 330/306
[58] Field of Search ................. 330/149, 109, 294, 306

[56] References Cited

U.S. PATENT DOCUMENTS

| | | | |
|---|---|---|---|
| 2,638,501 | 5/1953 | Coleman | 330/149 |
| 3,241,082 | 3/1966 | Van Ligten et al. | 330/149 |
| 3,525,052 | 8/1970 | Clark | 330/149 |
| 3,900,823 | 8/1975 | Sokal et al. | 330/149 |

Primary Examiner—Harold A. Dixon
Attorney, Agent, or Firm—Robert W. Keller; John J. Connors; Donald R. Nyhagen

[57] ABSTRACT

A low distortion phase compensated wideband amplifier system includes a low cost, power efficient Class C amplifier positioned along a primary signal path and a feedback loop coupled to provide negative feedback of distortion signal components in the amplified output signal. The negative feedback significantly reduces noise components including intermodulation noise while variable delay phase compensation permits a greater signal to noise ratio over a broader band of frequencies at the system output.

10 Claims, 2 Drawing Figures

WIDEBAND, PHASE COMPENSATED AMPLIFIER WITH NEGATIVE FEEDBACK OF DISTORTION COMPONENTS IN THE OUTPUT SIGNAL

BACKGROUND OF THE INVENTION

1. Field of the Invention

This invention relates to power amplifier systems and more particularly to power amplifier systems using feedback of distortion components in the system output signal to reduce distortion and improve frequency response over a wide band of frequencies.

2. Discussion of the Prior Art

Wideband amplifiers are useful in a broad variety of applications such as amplification of frequency division multiplexed communication signals. The wider the amplifier bandwidth, the fewer the number of amplifiers that may be required for a given application. Amplifiers which remain relatively linear over a broad range of frequencies are available for relatively non-demanding applications. However, when it is sought to use Class C operation for greater power output, higher gain, and greater power efficiency, it becomes much more difficult to provide linear and hence distortion free operation over a wide frequency range.

N. Sokal et al, U.S. Pat. No. 3,900,823 on "Amplifying And Processing Apparatus For Modulated Carrier Signals" issued Aug. 19, 1975 is exemplary of prior art devices. Devices such as those taught by Sokal et al attempt to linearly amplify amplitude modulated and single sideband and signals by detecting the modulating signal at the input and the output of an amplifier and developing a negative feedback signal from the difference to control the amplifier gain by controlling the input power supply voltage. Such an arrangement is not appropriate for wideband applications where several modulated carrier signals may be applied to the amplifier input simultaneously. Sokal et al also contemplate shifting the frequency or phase of the input to the amplifier system to compensate for non-linearities. They fail however to adequately provide for variable phase shifts resulting when frequencies are altered, as often occurs in wideband amplifier systems. Devices, such as the circuits presented in Sokal et al, provide adequate control of power amplifiers so long as the bandwidth of the signal being processed remains narrow so that the frequencies applied to the amplifier are relatively constant.

H. Stover, U.S. Pat. No. 3,810,018 on "Distortion Compensator For Phase Modulation Systems" issued May 7, 1974 is an example of an amplifier system with a distortion compensating circuit for phase modulation communication systems. Such a system incorporates fixed phase shifts and does not include a means for varying the phase shifts that are induced by frequency changes. Therefore the device will function satisfactorily only within a predetermined narrow frequency band.

In addition to the more common feedback linearization techniques, numerous attempts have been made to linearize amplifier systems through the use of feed-forward circuits. Many of the circuits incorporate phase and gain control means as well as delay networks but they also fail to compensate automatically for phase shifts arising from frequency variations. For instance, the below listed patents all incorporate fixed delay means in feedforward schemes which are calculated to compensate for phase shifts that occur between the feedforward signal and the primary signal as a function of the difference in transient time for the signal through the parallel circuits.

U.S. Pat. No. 3,471,798—Feedforward Amplifier, H. Seidel

U.S. Pat. No. 3,541,467—Feed-Forward Amplifier With Frequency Shaping, H. Seidel U.S. Pat. No. 3,815,040—Feed-Forward, Error-Correcting Systems, H. Seidel U.S. Pat. No. 3,873,936—Apparatus For Reducing Distortion In A Repeated Transmission System, Yo-Sung Cho U.S. Pat. No. 3,886,470—Feed-Forward Amplifier System, W. O'Neill et al W. Denniston et al, U.S. Pat. No. 3,922,617 on "Adaptive Feedforward System" issued Nov. 25, 1975 is a feed-forward system which includes feedback concepts calculated to enable the system to cope with varying circuit parameters. This feed-forward/feedback system compensates for varying parameters through the use of pilot signals which are of fixed frequency. Therefore the adaptive processes carried out by the circuitry provide adaptation for distortion created by uncontrolled variations in system components but fail to provide any adaption for wideband frequency variations in the signal being processed.

SUMMARY OF THE INVENTION

A wideband, phase compensated amplifier system in accordance with the invention includes an amplifier having at least one stage of signal amplification coupled along a primary signal path to receive a system input signal and providing an amplified system output signal from a system input, and a negative feedback loop that is coupled to separate out any distortion signal components appearing in the output signal. The distortion signal components are supplied to a negative feedback loop that is coupled to the primary signal path at the input of at least a last stage of the amplifier. The negative feedback loop includes a summing junction providing the distortion signal components as the difference between the system input signal and the system output signal. It also incorporates compensation circuitry including a bandpass filter, an amplifier, a frequency dependent delay equalizer and a phase shifter.

In many applications it is desirable to employ a nonlinear amplifier such as a Class C amplifier to reduce cost and improve power consumption efficiency. However, such amplifiers introduce unwanted distortion signal components, particularly intermodulation noise, into the output signal. The use of feedback in accordance with the invention significantly reduces this distortion to enable use of nonlinear amplifiers while the frequency dependent delay equalizer improves stability over a broad frequency range. The use of negative feedback normally tends to destabilize distortion signal components in the system output signal when loop gain is increased to improve the signal-to-noise ratio or when the bandwidth is increased, while fixed delays cause phase shifts which change with frequency and make wideband operation difficult. However, the delay equalizer in accordance with the invention helps compensate for these delay induced phase shifts by providing a phase shift which decreases with frequency to facilitate a wider band of stable operation at a desired loop gain.

BRIEF DESCRIPTION OF THE DRAWINGS

A better understanding of the invention may be had from a consideration of the following detailed description, taken in conjunction with the accompanying drawings in which.

DETAILED DESCRIPTION

Figure 1:
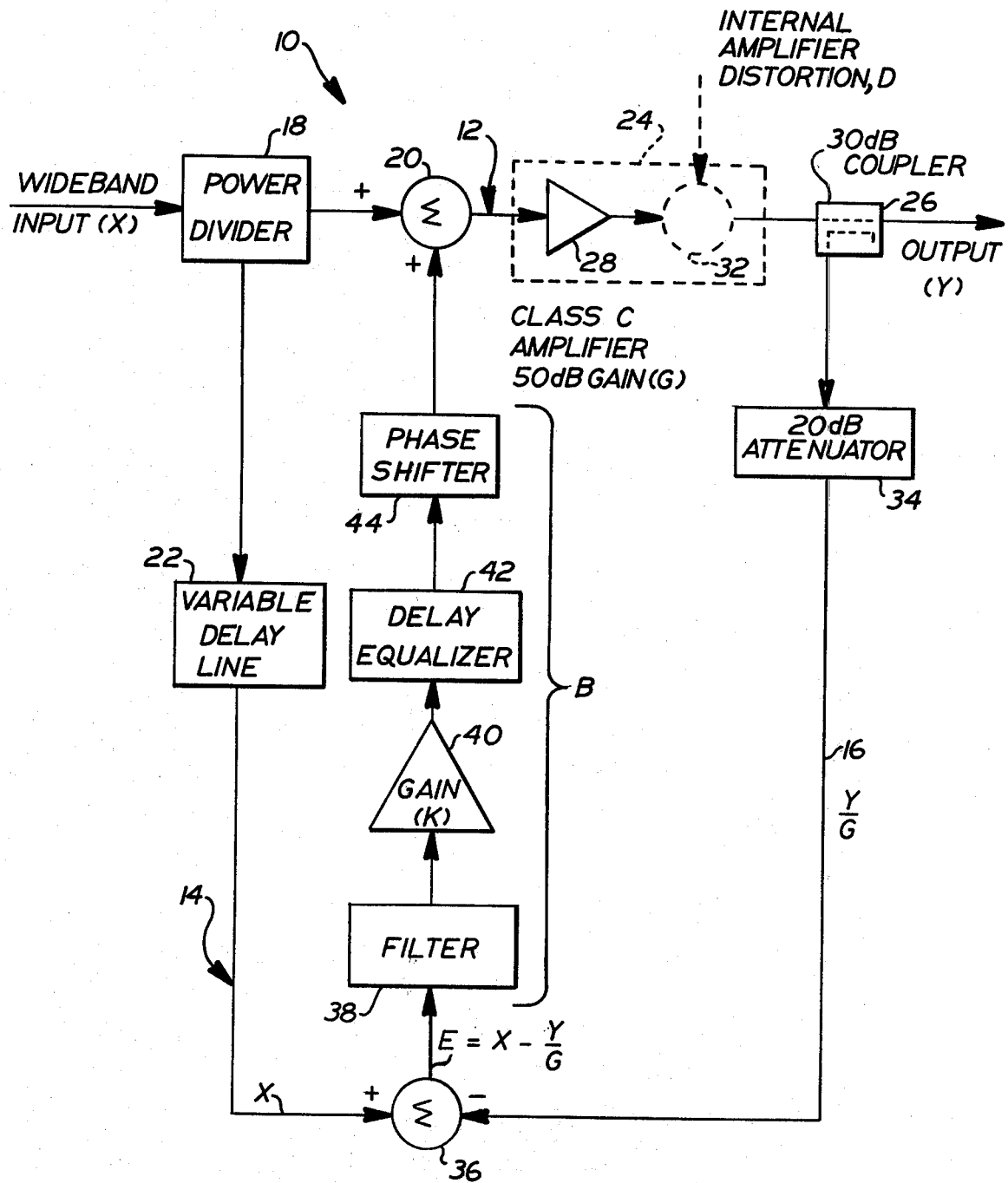
FIG. 1 is a block diagram and schematic representation of a wideband, phase compensated electronic amplifier in accordance with the invention.

Referring now to FIG. 1, a wideband phase and distortion compensated amplifier system 10 in accordance with the invention includes a primary signal path 12 extending between the system input and output, a parallel feed-forward path 14 and a negative feedback path 16. The primary signal path 12 includes a power divider 18 which receives a wide band system input signal, X, and divides that signal with a first portion of the input signal energy continuing along the primary signal path 12 to a summing junction 20. A second portion of the input signal energy is diverted to a variable delay line 22 in the parallel feed-forward path 14. From the power divided 18 the input signal continues along the primary signal path 12 to the summing junction 20 where it is added with a negative feedback signal containing distortion signal components appearing in the system output signal, designated Y. The output of summing junction 20 is communicated to the input of a nonlinear, high gain, high power amplifier 24 whose output is communicated through a coupler 26 to the output, Y, of the amplifier system 10. As illustrated, the power divider supplies equal amounts of power to the primary signal path 12 and the feed-forward path 14 and the coupler 26 is a 30 dB coupler.

For analytical purposes, the amplifier 24 is represented in FIG. 1 as including an amplifier 28 which in the preferred embodiment provides 50 dB of gain in two cascaded Class C stages, and a summing junction 32 which adds distortion terms, D, developed internally in the amplifier 28 to the output therefrom. It will be appreciated that in reality the signal distortion occurs within the two stages of amplifier 28. However, for analytical purposes relative to FIG. 1, the amplifier 28 is treated as a perfect, linear amplifier with the internal or inherent distortion (D) which arises in practice being separately combined at the output thereof is summing junction 32. It will be appreciated that distortion problems could be reduced by implementing amplifier 24 as a broad band Class A amplifier, but a broad band Class A amplifier is inefficient in terms of power consumption and expensive where it is desired to maintain constant gain linearity over a broad band of frequencies. It is therefore desirable to implement amplifier 24 in a less expensive and more efficient configuration such as a Class C amplifier. However, such amplifiers have the disadvantage of introducing significant distortion into the amplified output signal. One of the more significant components of this signal distortion is intermodulation noise which results from cross modulation by nonlinearities in amplifier 24 of input signal frequency components which occur at different frequencies within the bandwidth of the wideband system input signal. The present invention reduces this signal distortion, while maintaining acceptable linearity and flat frequency response over the wide bandwidth by use of negative feedback of the system output distortion signal components to the signal input of the amplifier 24.

Along feedback path 16, the output signal is attenuated 30 dB by coupler 26 and then attenuated an additional 20 dB by an attenuator 34 before presentation to a summing junction 36. This 50 dB of attenuation cancels the 50 dB of gain through amplifier 24 so that at summing junction 36 the feedback portion of the output signal, as represented by Y/G in FIG. 1, corresponds in amplification level to the feedforward portion of the input signal X. It should be noted that in an alternative embodiment the power divider 18 splits the power unequally and the attenuator 34 provides more than 20 dB attenuation to compensate for the additional loss associated with the secondary signal path 14. A variable delay line 22 is interposed between power divider 18 at the system 10 input and summing junction 36 to impose upon input signal X a delay which substantially matches the delay encountered by the input signal as it passes along the primary signal path and through the 20 dB attenuator 34. The two signals thus also have a corresponding phase shift at summing junction 36. An error signal E, provided by summing junction 36 to a filter 38, thus represents the difference between the original system input signal and the amplified system output signal with an amplification level substantially equal to that of the input signal and a phase delay substantially equal to that of the output signal. It contains the distortion components of the system output signal. Filter 38 is in this example a single tuned bandpass filter with attenuation of approximately 20 dB per decade at frequencies above and below the −3 dB corner frequencies of the passband. The output of filter 38 is communicated through a linear amplifier 40 having a gain of K, representing the loop gain of the feedback loop, to a delay equalizer such as a surface acoustic wave or SAW delay equalizer 42, as shown in FIG. 1.

Surface acoustic wave devices are well known and are discussed in the literature, as in an article by W. R. Smith, H. M. Girard, W. R. Jones entitled "Analysis and Design of Dispersive Interdigital Surface Wave Transducer," *IEEE Trans. on Microwave Theory & Techniques*, MTT-20, No. 7, July 1972. SAW delay equalizer 42 has a delay which is inversely proportional to frequency with a constant of proportionality which is selected to compensate and cancel phase changes which are directly proportional to frequency and result from fixed delays that are inherent in circuit components positioned around the loop. The SAW device is merely one practical example of a frequency dependent delay device that may be used in systems in accordance with the invention. Phase shifter 44 is coupled between the output of SAW delay equalizer 42 and summing junction 20 to produce a fixed phase shift to properly match the phase of the output signal distortion components to the phase of the input signal at summing junction 20 at a given frequency, such as the center of the system input and signal frequency band.

One of the problems of implementing a wideband feedback loop is the time delay inherent in practical devices, which time delay limits the frequency response of the loop. A constant delay for all frequencies results in an increasing phase shift with increasing frequency and eventually causes the loop to become unstable at sufficiently large bandwidths. A delay equalizer, such as the SAW delay equalizer 42 used in the preferred example, equalizes the phase shift at different frequencies to enable wideband stable feedback operation. This technique is applicable to any wideband feedback loop which has narrow band instantaneous frequency requirements. In particular, it reduces the problems of implementing a wideband feedback loop to reduce intermodulation distortion in power amplifiers.

The invention can be further understood by considering the system transfer function in some detail. In idealized form, the system output, Y, can be written as:

$$Y = D + G[X + (X - Y/G)B] \quad (1)$$

$$Y = D/(1+B) + GX \quad (2)$$

where B is a generalized function representing feedback compensation circuitry in the form of filter 38, amplifier 40, SAW delay equalizer 42, and phase shifter 44. As can be seen from equation (2), the output has the desired gain, G, while the distortion components are reduced by a factor of $1+B$. It is not feasible in a practical system to make the distortion components arbitrarily small, so as to produce a high quality signal, by merely increasing B (as by increasing the gain, K, of amplifier 40). The fixed delays imposed by primary signal path 12 and feedback path 14 result in ever increasing phase shifts for the feedback signal as frequencies increase above the amplifier band center frequency. These phase shifts result in decreased stability as the phase shifts pass 90° and approach 180°. Consequently, tradeoffs must be made between the amplifier bandwidth and the magnitude of B in practical applications.

A wideband amplifier was tested using 5 IF carrier signals within a bandwidth of 250±1.5 MHz, but without a feedback coupling. It was found that the output noise level was down approximately 18 dB from the carrier signals using amplifier 24. In an example with feedback, arranged substantially as shown in FIG. 1, but with SAW delay equalizer 42 omitted, using a loop gain, K, of 7 dB and a bandwidth of 5.5 MHz for single tuned filter 38, the noise was reduced to 25 dB below the signal magnitudes within the passband but increased to nearly equal the signal magnitude just outside the passband.

The analysis of system 10 can be somewhat simplified by using a frequency shift and treating the center frequency of the amplifier band as DC. Single tuned filter 38 can then be treated as a single pole low filter within a Laplace domain transfer function of:

$$F(s) = \frac{\omega_o}{s + \omega_o} \quad (3)$$

where $\omega_o$ is the $-3$ dB frequency of the filter.

Using this representation for the filter and ignoring equalizer 42 as well as delays in the system, equation (2) becomes:

$$Y(s) = \frac{D(s)}{1 + \frac{K\omega_o}{s + \omega_o}} + G(s) X(s) \quad (4)$$

Letting $s = j\omega$ where $j = \sqrt{-1}$, equation (4) becomes:

$$Y(j\omega) = \frac{D(j\omega)}{1 + \frac{K\omega_o}{j\omega + \omega_o}} + G(j\omega) X(j\omega) \quad (5)$$

Letting $Y_D$ be the distortion term of equation (5) and letting $\theta = \tan^{-1}(\omega/\omega_o)$, $Y_D$ is:

$$Y_D = \frac{D(j\omega)}{1 + \frac{K\omega_o \, e^{-j\theta}}{\sqrt{\omega^2 + \omega_o^2}}} \quad (6)$$

$$Y_D = \frac{D(j\omega)}{1 + \frac{K\omega_o}{\sqrt{\omega^2 + \omega_o^2}} \cos\theta - j \frac{K\omega_o}{\sqrt{\omega^2 + \omega_o^2}} \sin\theta} \quad (7)$$

$$|Y_D| = \frac{|D(j\omega)|}{\left| 1 + \frac{K^2 \omega_o^2}{\omega^2 + \omega_o^2} + \frac{2 K\omega_o \cos\theta}{\sqrt{\omega^2 + \omega_o^2}} \right|^{\frac{1}{2}}} \quad (8)$$

It can be readily seen that stability of $Y_D$ can begin to continuously decrease as $\theta$ increases beyond 90° and approaches 180°. As stability decreases the system tends to oscillate at smaller values of gain, K. The problem becomes exacerbated when fixed or constant delays, $\tau_o$, inherent in the feedback loop are taken into account by letting $$\theta = \omega \tau_o = \tan^{-1}(\omega/\omega_o) \quad (9)$$

In fact if $\tau_o$ is greater than $1/\omega_o$, $\cos\theta$ changes sign while the magnitude of its coefficient is still large and the loop becomes regenerative. The loop begins to increase the error rather than reduce the error and instability is possible for sufficiently large K and $\tau_o$.

This problem can be reduced by adding equalizer 42 with a delay between two frequencies $\omega_1$ and $\omega_2$ of $$\tau_{SAW} = \tau_s - \alpha \omega \quad (10)$$

where $\tau_s$ is the delay at $\omega = 0$ and $\alpha$ is a scaling factor. $\theta$ then becomes, $$\theta = \omega \tau_o + \omega \tau_{SAW} + \tan^{-1}(\omega/\omega_o) \quad (11)$$

$$\theta = \omega(\tau_o + \tau_s) - \alpha \omega^2 + \tan^{-1}(\omega/\omega_o) \quad (12)$$

Ignoring the arc tan term, $\theta$ remains reasonably constant in a region where $d\theta/d\omega$ is zero or remains small. This occurs when $$\alpha = \frac{\tau_o + \tau_s}{2\omega} \quad (13)$$

By selecting $\alpha$ in accordance with equation (13) by using $\omega = \omega_c$, the center frequency of the amplifier band, the fixed center frequency phase shift can be compensated by phase shifter 44 and the rate of change of phase shift with frequency will be small near $\omega_c$.

From the second derivative of $v$, $$\frac{d^2\theta}{d\omega^2} = -2\alpha \quad (14)$$

a it can be determined that $\alpha$ must be kept small to increase the bandwidth. This can be done by trying to keep $\tau_o$ and $\tau_s$ small or by making $\omega$ large, which is equivalent to operating at a smaller percentage bandwidth.

Figure 2:
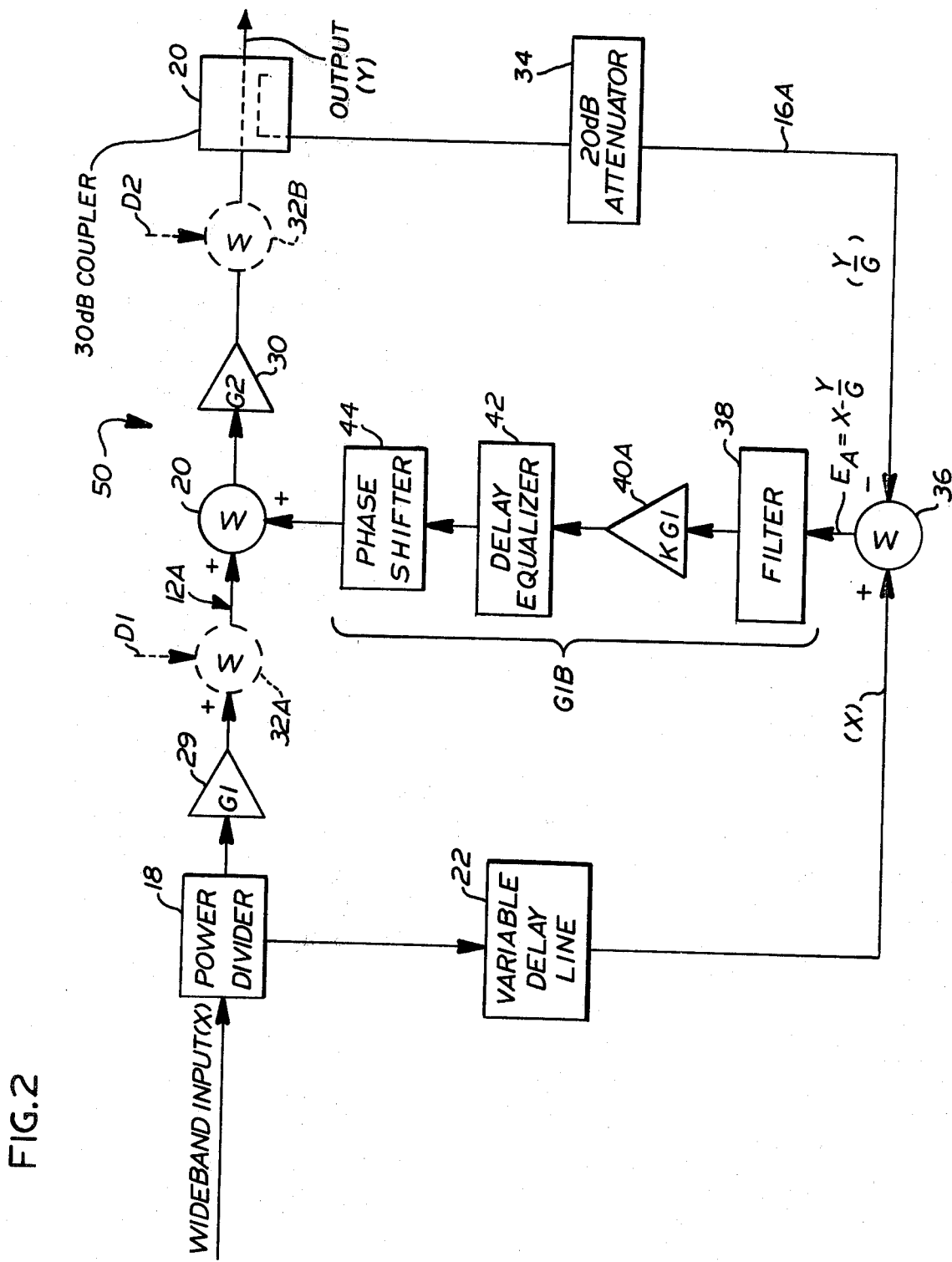
FIG. 2 is a block diagram and schematic representation of an alternative embodiment of a wideband, phase compensated electronic amplifier system in accordance with the invention.

Referring now to FIG. 2, there is shown an alternative arrangement of a wide band phase and distortion compensated amplifier in accordance with the invention as represented by amplifier system 50. Amplifier system 50 is similar to amplifier system 10 except that the negative feedback of distortion components of the output signal are provided through summing junction 20 along the primary signal path 12A midway between two stages 29 and 30 of the power amplifier 24 which now retains the same total gain of 50 dB divided between stage 29 with gain GI and stage 30 with gain G2. The distortion introduced by stage 29 is represented as being added to the signal as distortion D1 at summing junction 32A while the distortion introduced by stage 30 is represented as being introduced into the signal path as distortion D2 at summing junction 32B.

Letting the gain, G, of amplifier 24 equal $G1 \times G2$, the output YA of amplifier system 50 is, $$YA = [G1X + D1 + G1B(X - \frac{Y}{G})]G2 + D2 \quad (15)$$

$$YA = GX + \frac{G2D1}{1+B} + \frac{D2}{1+B} \quad (16)$$

If it is recognized that D of system 10 is a lumped parameter having the function $$D = G2d1 + D2 \quad (17)$$

it can be seen that equation (16) for system 50 is the same as equation (2) for system 10. However, since the feedback loop only extends around amplifier stage 30, the time delay and consequent phase shift are reduced. This aids in the maintenance of a somewhat greater bandwidth or greater noise attenuation. As a tradeoff, the arrangement of system 50 requires additional amplification in the feedback loop to bring the feedback signal up to the magnitude level at the output of amplifier stage 29.

While there have been shown and described above alternative arrangements of a wide band phase and distortion compensated amplifier system in accordance with the invention for the purpose of enabling a person of ordinary skill in the art to make and use the invention, it will be appreciated that the invention is not limited thereto. Accordingly, any modifications, variations or equivalent arrangements within the scope of the attached claims should be considered to be within the scope of the invention.

What is claimed is:

1. An amplifier system comprising:
    an amplifier having at least one stage of signal amplification coupled along a primary signal path to receive a system input signal and provide an amplified system output signal in response thereto;
    a negative feedback loop having fixed time delays therealong and including a summing junction coupled to provide distortion signal components as the difference between the system input signal and a portion of the amplified system output signal, the negative feedback loop being coupled to provide the distortion signal components as negative feedback to the primary signal path by adding the distortion signal components to the input signal ahead of a first amplifier stage, the negative feedback loop further including a bandpass filter with a passband at a range of frequencies corresponding to the information content of the input signal, an amplifier coupled to amplify the distortion signal components, and a delay equalizer having a time delay therethrough which varies inversely with frequency.

2. The amplifier system according to claim 1 above, wherein the delay equalizer is a surface acoustic wave (SAW) device.

3. The amplifier system according to claim 2 above, wherein the SAW device has a delay, $\tau_{SAW} = \tau_s = a\omega$, where $\tau_s$ is a constant, $\omega$ is frequency in radians per second and $a = (\tau_o + \tau_s/2\omega_c)$ where $\tau_o$ is the fixed delay inherent in the feedback loop, and $\omega_c$ is the center frequency in radians per second of the frequency band being amplified.

4. An amplifier system comprising:
    an amplifier having at least two stages of signal amplification coupled along a primary signal path to receive a system input signal and provide an amplified system output signal in response thereto; and
    a negative feedback loop having fixed time delays therealong and including a summing junction coupled to receive the system input signal and an attenuated indication of the amplified system output signal and to provide distortion signal components as the difference between the system input signal and the attenuated indication of the amplified system output signal, the negative feedback loop further including a bandpass filter with a passband at a range of frequencies corresponding to the information content of the input signal, an amplifier coupled to amplify the distortion signal components, a delay equalizer having a time delay therethrough which varies inversely with frequency and a summing junction coupled to add the amplified, filtered and equalizer delayed distortion signal components to the input signal at a position along the primary signal path between a first and a last stage of the amplifier.

5. A wideband, phase and distortion compensated amplifier system comprising:
    a power amplifier coupled to receive a system input signal and provide as an output an amplifier system input signal plus distortion signal components; and
    a negative feedback loop coupled to receive the system input signal and the output, the negative feedback loop including a summing junction providing distortion signal components as the difference between the system input signal and the output and a bandpass filter coupled to receive the distortion signal components from the summing junction and provide filtered distorted signal components as an output, and a delay equalizer having a signal time delay therethrough which varies inversely with signal frequency, the delay equalizer being coupled to receive as an input the filtered distortion signal components and provide as a signal input for amplification by the amplifier, delay equalized, filtered distortion signal components.

6. A wideband, phase compensated electronic amplifier system receiving a signal having a given frequency band as a system input signal and providing an amplifier system input signal as a system output signal, the amplifier system comprising:
    a nonlinear amplifier coupled to receive an amplifier input signal and provide as an output signal the system output signal including amplified system input signal components and distortion signal components;
    a first summing junction coupled to receive the system input signal and the system output signal and provide a distortion component signal as the difference therebetween indicating distortion signal components in the system output signal;

compensation circuitry including a bandpass filter having a pass band that includes at least a portion of said given frequency band, an amplifier, a delay equalizer having a time delay therethrough that decreases with frequency and a phase shifter imparting a given phase shift characteristic to signals passing therethrough, the compensation circuitry being coupled to receive the distortion component signal from the first summing junction as an input and provide a frequency filtered, phase and gain compensated distortion component signal as an output signal; and a second summing junction coupled to receive the system input signal and the compensation circuitry output signal and provide to the amplifier the amplifier input signal as the sum of the system input signal and the compensation circuitry output signal with the compensation circuitry output signal providing negative feedback of distortion signal components in the system output signal within said given frequency band.

7. A wideband, phase compensated electronic amplifier system receiving a signal having a given frequency band as a system input signal and providing an amplified system input signal as a system output signal, the amplifier system comprising:

a nonlinear amplifier having at least first and last separate amplification stages providing successive amplification of signals passing along a signal path therethrough, the amplifier being coupled to receive the system input signal as an amplifier input signal and provide as an output the system output signal including amplified system input signal components and distortion signal components;

a first summing junction coupled to receive the system input signal and the system output signal and provide a distortion component signal as the difference therebetween indicating distortion signal components in the system output signal;

compensation circuitry including a bandpass filter having a pass band that includes at least a portion of said given frequency band, an amplifier, a delay equalizer having a time delay therethrough that decreases with frequency and a phase shifter imparting a given phase shift characteristic to signals passing therethrough, the compensation circuitry being coupled to receive the distortion component signal from the first summing junction as an input and provide a frequency filtered, phase and gain compensated distortion component signal as an output signal; and a second summing junction disposed along the signal path through the amplifier between the first and last stage, the second summing junction being coupled to receive a signal indicative of the system input signal from an immediately preceding amplifier stage and the compensation circuitry output signal and provide to an immediately succeeding stage of the amplifier as a signal input thereto the sum of the signal indicative of the system input signal and the compensation circuit output signal with the compensation circuitry output signal providing negative feedback of distortion signal components in the system output signal within said given frequency band.

8. The amplifier system according to claim 6 or 7 above, further comprising means for coupling the first summing junction to the system input and the system output to provide the system input signal and system output signal to the first summing junction with corresponding phase angles and magnitude levels.

9. The amplifier system according to claim 6 or 7 above, wherein the delay equalizer is a surface acoustic wave device.

10. The amplifier system according to claim 9 above, wherein the time delay relationship of the surface acoustic wave device varies with frequency such that within the given frequency band the phase lag of signals passing therethrough decreases with increasing frequency.

* * * * *